(12) United States Patent
Shimooka

(10) Patent No.: US 7,972,887 B2
(45) Date of Patent: Jul. 5, 2011

(54) MICRO-ELECTRO-MECHANICAL-SYSTEM PACKAGE AND METHOD FOR MANUFACTURING THE SAME

(75) Inventor: Yoshiaki Shimooka, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 12/252,830

(22) Filed: Oct. 16, 2008

(65) Prior Publication Data

US 2009/0107692 A1 Apr. 30, 2009

(30) Foreign Application Priority Data

Oct. 17, 2007 (JP) ................................ P2007-270449

(51) Int. Cl.
*H01L 21/00* (2006.01)
(52) U.S. Cl. .................... 438/51; 257/E21.499
(58) Field of Classification Search ............. 438/51–55, 438/106–127; 257/E21.215, E21.499, E21.502, 257/E21.613, E23.133
See application file for complete search history.

(56) References Cited

U.S. PATENT DOCUMENTS

| | | | |
|---|---|---|---|
| 5,589,082 A | 12/1996 | Lin et al. | |
| 6,936,494 B2* | 8/2005 | Cheung | 438/55 |
| 7,008,812 B1 | 3/2006 | Carley | |
| 7,381,583 B1* | 6/2008 | Ebel et al. | 438/53 |
| 7,417,307 B2* | 8/2008 | Haluzak et al. | 257/682 |
| 2007/0001224 A1 | 1/2007 | Yamaguchi et al. | |

OTHER PUBLICATIONS

Hiroki Tsuda, et al., "Optical Properties of Pb(Zr, Ti) O$_3$ Films Prepared by Aerosol Deposition", IEEE Transactions on Ultrasonics, Ferroelectrics, and Frequency Control, vol. 55, No. 5, May 2008, pp. 975-979.
Jun Akedo, "Aerosol Deposition and Its Application", Surface Science, vol. 25, No. 10, pp. 635-641, Aug. 9, 2004 (acceptance date for publication ).
K. Machida, et al., "Novel Global Planarization Technology for Interlayer Dielectrics Using Spin on Glass Film Transfer and Hot Pressing", J. Vac. Sci. Technol. B, vol. 16, No. 3, May/Jun. 1998, pp. 1093-1097.

* cited by examiner

*Primary Examiner* — Brook Kebede
(74) *Attorney, Agent, or Firm* — Oblon, Spivak, McClelland, Maier & Neustadt, L.L.P.

(57) ABSTRACT

According to an aspect of the present invention, there is provided a method for manufacturing a MEMS package, the method including: forming a MEMS device on a substrate; forming a sacrificing member on the MEMS device; forming a cavity formation film on the sacrificing member; forming a through hole in the cavity formation film at a portion other than above the MEMS device; removing the sacrificing member through the through hole, thereby forming a cavity around the MEMS device; and forming a seal layer on the cavity formation film to block the through hole and to seal the cavity, by performing a film forming process in which a seal layer material is straightly applied in a direction of perpendicular to a surface of the substrate.

18 Claims, 4 Drawing Sheets

US 7,972,887 B2

MICRO-ELECTRO-MECHANICAL-SYSTEM PACKAGE AND METHOD FOR MANUFACTURING THE SAME

CROSS-REFERENCE TO RELATED APPLICATIONS

The entire disclosure of Japanese Patent Application No. 2007-270449 filed on Oct. 17, 2007, the entire contents of which are incorporated herein by reference.

BACKGROUND OF THE INVENTION

Micro-electro-mechanical-system (MEMS) devices are airtightly sealed to protect the MEMS devices from external influence, similarly to general semiconductors. However, the MEMS device has a movable portion of a cantilever structure or a fixed-fixed beam structure, which is deformable by an electric force or an external force such as an acceleration force. The MEMS device has a cavity due to operating characteristics of the movable portion. Accordingly, a sealing structure capable of maintaining the state of the cavity is required to be applied thereto. A metal cap type package having been applied thereto is known as such a sealing structure. However, enlargement of the package is inevitable. Thus, recent demands for miniaturization of the MEMS device cannot be satisfied.

To cope with such a problem, a structure for sealing the MEMS device in the cavity in the following process has been proposed (see, e.g., JP-2005-123561-A). That is, a sacrificing layer for covering the MEMS device is formed. Then, a film, in which a through hole communicating with the sacrificing layer is formed, is stacked thereon. Subsequently, the sacrificing layer is selectively removed through this through hole. Then, a sealing layer is stacked thereon so as to block the through hole. Hitherto, the sealing layer has been formed by a sputtering method, a chemical vapor deposition (CVD) method or the like.

However, when the sealing layer is formed by, e.g., a CVD method, a film formation material or the like extending from the through hole is liable to adhere to the MEMS device. This degrades the characteristic of the device.

SUMMARY OF THE INVENTION

According to an aspect of the present invention, there is provided a method for manufacturing a MEMS package, the method including: forming a MEMS device on a substrate; forming a sacrificing member on the MEMS device; forming a cavity formation film on the sacrificing member; forming a through hole in the cavity formation film at a portion other than above the MEMS device; removing the sacrificing member through the through hole, thereby forming a cavity around the MEMS device; and forming a seal layer on the cavity formation film to block the through hole and to seal the cavity, by performing a film forming process in which a seal layer material is straightly applied in a direction of perpendicular to a surface of the substrate.

According to another aspect of the present invention, there is provided a MEMS package including: a substrate; a MEMS device formed on the substrate; a cavity formation film that is formed on the substrate to define a cavity around the MEMS device and that includes a through hole formed therein at a portion other than above the MEMS device; and a seal layer formed on the cavity formation film to block the through hole and to seal the cavity.

DETAILED DESCRIPTION OF THE INVENTION

Hereinafter, embodiments of the invention are described with reference to the accompanying drawings. In the following description, the embodiments of the invention are described based on the drawings. However, the drawings are provided for an illustrative purpose only. The invention is not limited to the drawings.

First Embodiment

Figure 1:
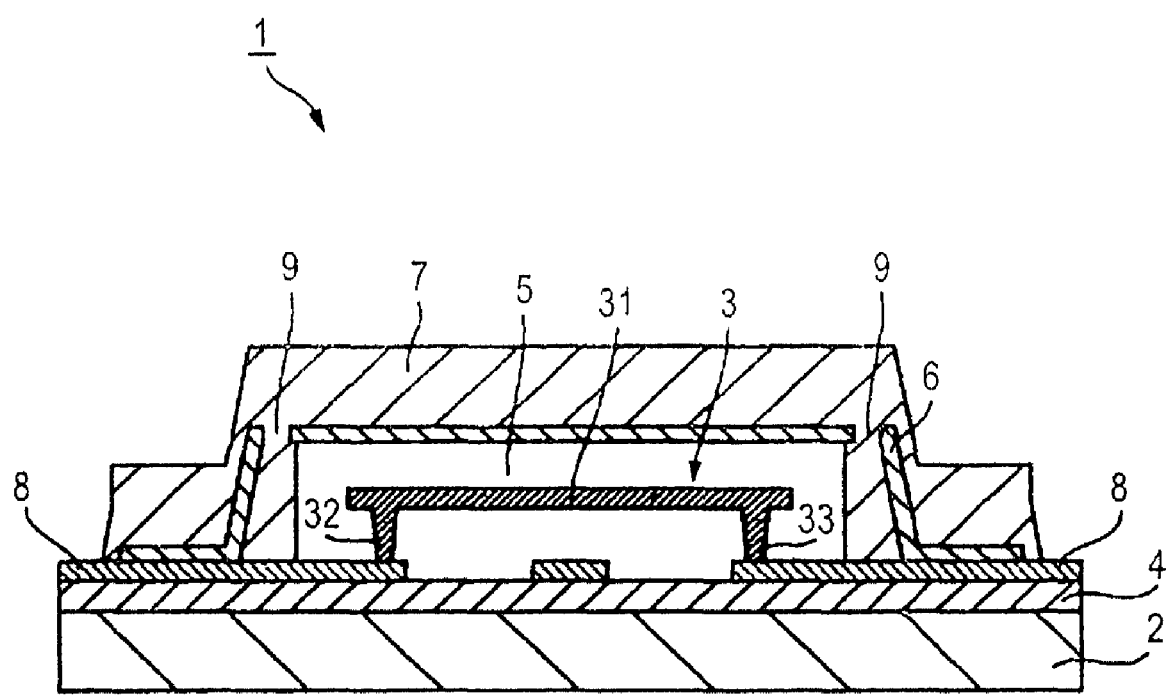
FIG. 1 is a cross-sectional view schematically illustrating the configuration of a MEMS package according to a first embodiment of the invention.

FIG. 1 is a cross-sectional view schematically illustrating the configuration of a MEMS package according to a first embodiment of the invention.

As illustrated in FIG. 1, a MEMS package 1 according to the first embodiment includes a semiconductor substrate 2, a MEMS device 3, a cavity formation film 6, and a seal layer 7.

Wiring layers 8 of a signal line, a power supply line, a ground line and the like, for operating the MEMS device 3 are formed on the semiconductor substrate 2 via an insulating layer 4. The semiconductor substrate 2 is a substrate of the MEMS package 1. Alternatively, e.g., an insulating substrate made of glass, a synthetic resin, or the like can be used as the substrate.

Each of the wiring layers 8 is electrically connected to the MEMS device 3 and exchanges electrical signals with an external device. A metal film made of, e.g., Au, Cr, Rt, Ti, Ni, Al, Cu, or Pt, or an alloy metal film made of an alloy of such metals, or a conductive film formed by multilayer lamination of such metal films can be applied to the wiring layer 8. In this case, after a metal film is formed by a sputtering method, a metal evaporation method, a chemical vapor deposition (CVD) method, or the like, is patterned by photolithography or the like. Further, the type of the wiring layer 8 is not limited, and can be appropriately selected from, for example, a coplanar line, a microstrip line, a grounded coplanar line, or a simple thin film signal line according to a required specification.

The MEMS device 3 has a fixed-fixed beam structure including a movable portion 31 and support portions 32 and 33. The movable portion 31 is constructed to be deformable in the direction of thickness of the semiconductor substrate 2. The movable portion 31 is constituted by a metal film made of a metal, such as Al or Cu. Although this embodiment employs the MEMS device 3 of the fixed-fixed beam structure, a MEMS device 3 of a cantilever structure can be employed. For example, the MEMS device 3 may be an electrostatic micro-switch, an electrostatic micro-relay, a micro-mechanical relay, an acceleration sensor, a pressure sensor, an actuator or the like.

A cavity 5 having a capacity enough to operate the MEMS device 3 is formed on the inner side of the cavity formation film 6. The cavity formation film 6 is formed on the semiconductor substrate 2 to cover the MEMS device 3. Further, the cavity formation film 6 is provided with a through hole 9. The outer shape of the cavity formation film 6 is, for example, a columnar shape such as a quadrangular prism or a cylinder, a prismoid shape obtained by cutting a top portion of a pyramid such as a cone, a hexagonal pyramid, or a quadrangular pyramid, as a whole, and a hemisphere shape such as a domical shape. In this embodiment, the outer shape of the cavity formation film 6 is a quadrangular prismoid shape. The through hole 9 is formed in a part of the top surface of the quadrangular prismoid (incidentally, the part of the top surface thereof is other than a part located just above the MEMS device 3).

The seal layer 7 is formed on the cavity formation film 6 and blocks the through hole 9 provided in the cavity formation film 6 to thereby seal the MEMS device 3 in the cavity 5. The seal layer 7 is formed by a film forming method in which a film formation material is straightly applied in a direction perpendicular to a surface of the substrate 2. Such a method is, e.g., an aerosol deposition method (hereunder referred to as an AD method), and a spin coating film transfer and hot-pressing (STP) method (for example, refer to (6) Akedo et al., "Aerosol Deposition and Its Application", Surface Science Vol. 25, No. 10, pp 635-641, 2004, and Machida et al., "Novel global planarization technology for interlayer dielectrics using spin on glass film transfer and hot pressing", J. Vac. Sci. Technol. B, Vol. 16, No. 3, May/June 1998). Preferably, among such methods, the AD method is used, because a film can be formed without being heated, and low damage is given to the MEMS device 3. This embodiment employs the AD method. The shape of the seal layer 7 is not limited. A shape similar to that of the cavity formation film 6 can be employed as that of the seal layer 7. Other shapes can be employed as that of the seal layer 7. This embodiment employs a shape formed by stacking two different quadrangular prismoids that differ in size from each other as the shape of the seal layer 7.

Further, because the through hole 9 is formed in a part of the top surface of the cavity formation film 6 (incidentally, the part of the top surface thereof is other than a part located just above the MEMS device 3), a part of the seal layer 7 is deposited just under the through hole 9 formed in the cavity formation film 6. Because the seal layer 7 is formed by the AD method, the film formation material can be applied straightly in the direction perpendicular to a surface of the substrate 2. Accordingly, since the turning of the film formation material from the through hole 9 to the MEMS device 3 can be suppressed, an amount of the film formation material adhering to the MEMS device 3 can be suppressed low. In addition, since the seal layer 7 is also deposited on the inner side of the cavity formation film 6 as illustrated in FIG. 1, the mechanical strength of each end portion of the cavity formation film 6 can be increased.

The MEMS package 1 according to the present embodiment is manufactured in, e.g., the following method. FIGS. 2A to 2G are cross-sectional views schematically illustrating steps of a method for manufacturing the MEMS package 1 illustrated in FIG. 1.

Figure 2A:
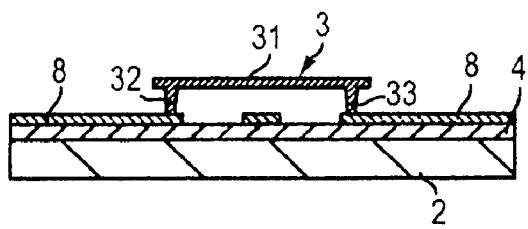
FIGS. 2A to 2G are cross-sectional views schematically illustrating steps of a method for manufacturing a MEMS package illustrated in FIG. 1.

First, as illustrated in FIG. 2A, the wiring layer 8 is formed on the semiconductor substrate 2 via the insulating layer 4. Then, the MEMS device 3 including the movable portion 31 and the support portions 32 and 33 is formed on the wiring layer 8. The wiring layer 8 is formed by performing patterning according to the photolithography method after a metal film (e.g., an Al film, or a Cu film) is formed on the insulating film 4 by the sputtering method. An insulating layer (not shown) for protecting wiring is formed on a part of the wiring layer 8. The MEMS device 3 is formed by a known method utilizing a sacrificing layer made of a material such as polyimide.

Subsequently, a sacrificing layer 10 made of a material such as polyimide is stacked on the semiconductor substrate 2. Then, an organic insulating film such as a resist 12 is applied onto the sacrificing layer 10. The resist 12 is used as a mask member in the next taper etching step. The resist 12 is used as a sacrificing member, together with the sacrificing layer 10, also for forming the cavity formation film 6.

Figure 2E:
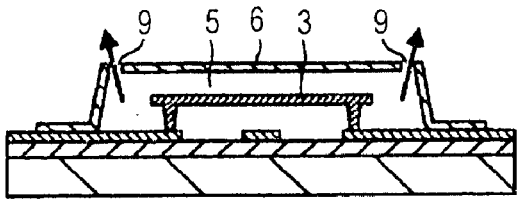
Figure 2B:
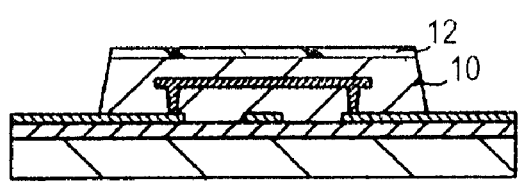

As illustrated in FIG. 2B, the sacrificing layer 10 is shaped like a quadrangular prismoid by using the resist 12 as a mask member and by performing taper etching. In the taper etching, a taper angle is adjusted by controlling, for example, the gas condition of an etching gas. The taper etching is performed by dry etching such as reactive ion etching (RIE). During the taper etching, the thickness of the resist 12 is liable to decrease with the progress of etching. Thus, the thickness of the resist 12 formed on the sacrificing layer 10 may be preliminarily determined so that the top surface of the sacrificing layer 10 is covered with the resist 12 after the etching have been completed.

Figure 2F:
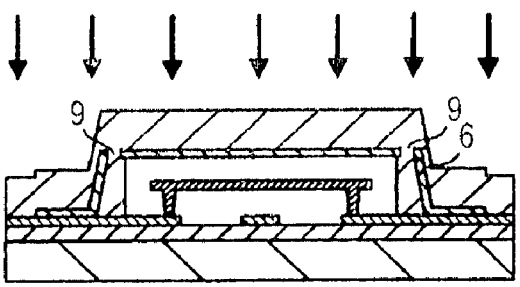
Figure 2C:
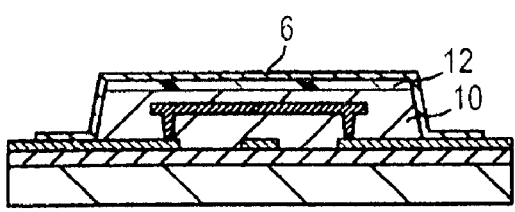
Figure 2G:
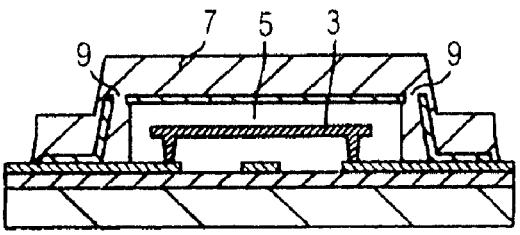

Subsequently, as illustrated in FIG. 2C, the cavity formation film 6 is formed by the sputtering method, the CVD method and the like so as to entirely cover the quadrangular-prismoid-like sacrificing layer 10 and the resist 12. According to this embodiment, silicon dioxide $SiO_2$ or the like is used as the material of the cavity formation film 6 to reduce the damage on the sacrificing layer 10 in the forming process of the cavity formation film 6 and to maintain the etching selectivity between the sacrificing layer 10 and the cavity formation film 6.

Figure 2D:
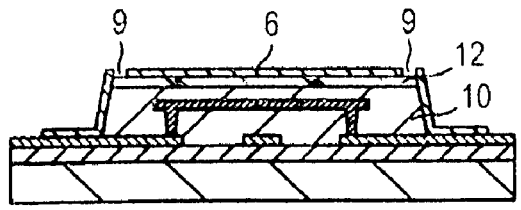

As illustrated in FIG. 2D, a part of the cavity formation film 6, more specifically, a part of the top surface of the quadrangular-prismoidal film is removed using the photolithography method, the dry etching method, or the like. Then, the through hole 9 for removing the sacrificing members (the sacrificing layer 10 and the resist 12) is formed in the cavity formation film 6. While the through hole 9 is formed in a part of the top surface of the cavity formation film 6, the through hole 9 is positioned to avoid a part located just above the MEMS device 3 to thereby prevent the characteristics of the MEMS device 3 from being adversely affected by the formation of the through hole 9 and the subsequent etching.

As illustrated in FIG. 2E, the resist 12 and the sacrificing layer 10 made of polyimide are collectively removed through the through hole 9 in the cavity formation film 6 by ashing. Thus, the cavity 5 is formed around the MEMS device 3.

A illustrated in FIG. 2F, a thin film made of a ceramic material (e.g., $Al_2O_3$, AlN, $MgB_2$, $PZT[Pb(Zr_{52}, Ti_{48})O_3]$, and Ni—Zn—$Fe_3O_4$) is formed on the cavity formation film 6 using the AD method. Subsequently, the seal layer 7 is patterned by the photolithography method, or the dry etching method (see FIG. 2G). Consequently, the through hole 9 is blocked by the resin layer 7, and the MEMS device 3 is sealed in the cavity 5.

According to the AD method, the film formation material, such as a ceramic material, is mechanically crushed into fine particles whose diameters are about 0.08 µm to 2 µm. Then, an aerosol is generated by stirring and mixing the fine particles with a gas in a reduced-pressure atmosphere. The aerosol is transported by gas and is passed through a nozzle having a minute opening diameter that is equal to or less than 1 mm. Subsequently, a film is formed by spraying the aerosol onto the substrate or the like. The speed of the fine particle transported by gas is accelerated to hundreds meters per second (m/s). The kinetic energy of the accelerated fine particle is converted into local thermal energy by the collision of the particle with the substrate or the like. Thus, the bonding between the substrate and the fine particle and the bonding between the fine particles are realized. Thus, according to the AD method, a film can be formed without extra heating process. The temperature of the substrate merely rises slightly. Accordingly, damage on the MEMS device 3 is suppressed low.

In addition, according to the AD method, high-density and high-adhesion-strength films can be formed. Thus, the seal layer 7 formed by the AD method excels in sealing-reliability.

Further, according to the AD method, the straightness of the trajectory of the fine particles sprayed from the nozzle is high. Thus, by spraying the fine particles in a direction perpendicular to the substrate, the fine particles can be deposited in the direction perpendicular to the substrate without the turning of the film formation material from the through hole 9 to the MEMS device 3. Accordingly, an amount of the film formation material adhering to the MEMS device 3 is suppressed low.

As described above, according to this embodiment, the seal layer 7 is formed using the AD method. Consequently, degradation of the characteristics of the MEMS device 3 can be prevented. In addition, a highly reliable MEMS package 1 can be provided.

In this embodiment, although the seal layer 7 is patterned by the photolithography method and the dry etching method after the thin film made of the ceramic material is formed by the AD method, the seal layer 7 can be formed using a stencil mask on which openings are formed at the desired portions. In this case, the ceramic material is supplied from the nozzle onto the shielding mask positioned at a given position on the cavity formation film 6, using the AD method. Subsequently, the stencil mask is displaced. Thus, the seal layer 7 can be formed by performing film formation and patterning at a time. Consequently, working efficiency can be enhanced.

Although this embodiment uses the AD method for forming the seal layer 7, the STP method can be also used to form the seal layer 7. In the case of using the STP method, a sealing material (e.g., $SiO_2$) is coated onto a film. Then, the sealing material coated on the film is transferred onto the cavity formation film 6 by being pressurized and heated. Subsequently, the film is peeled off, so that the seal layer 7 is formed on the cavity formation film 6. According to the STP method, even when the through hole 9 is formed on a part of the top surface of the cavity formation film 6, the sealing material is prevented from being deposited inside the cavity.

Furthermore, although the outer shape of the cavity formation film 6 is formed like a quadrangular prismoid, the outer shape of the cavity formation film 6 can be formed like another kind of a prismoid, a dome (a hemisphere), or a cylinder. In the case of forming the cavity formation film 6 like a dome, the sacrificing layer 10 is formed of a photoresist or a photosensitive material, and then the sacrificing layer 10 is formed like a dome by being annealed at a temperature of about 300° C. Moreover, a film having a through hole 9 is formed thereon, and then the sacrificing layer 10 is removed through the through hole 9. Thus, the dome-like cavity formation film 6 is obtained. Preferably, a prismoid-like shape or a dome-like shape is applied to the outer shape of the cavity formation film 6. In a case where the cavity formation film 6 is formed into prismoid-like shape or dome-like shape, the uniformity of the film formation on a top surface portion and on a side surface portion can be increased as compared with the case where the cavity formation film 6 is formed into cylinder shape. Consequently, when the entire MEMS device is packaged, a crack or the like in the package can be prevented from being caused by impact or stress. Accordingly, the MEMS package using the prismoid-like or dome-like cavity formation film 6 excels in the sealing-reliability.

$SiO_2$ can be used as the material of the sacrificing layer 10. In this case, SiN is preferable as the materials of the cavity formation film 6 in order to reduce the damage applied on the sacrificing layer 10, and to maintain the etching selectivity between the sacrificing layer 10 and the cavity formation film 6. The resist 12 is removed through the through hole 9 in the cavity formation film 6 by ashing. And, the sacrificing layer 10 made of $SiO_2$ is removed using an etchant, such as a buffer hydrofluoric acid, which can selectively dissolve the sacrificing layer 10 made of $SiO_2$. Thus, the cavity 5 is formed around the MEMS device 3. The resist 12 can be removed by a wet etching method. In the case of the sacrificing layer 10 made of $SiO_2$, the sacrificing layer 10 can be removed by the RIE method or the dry etching method using hydrofluoric acid vapor, instead of the wet etching method.

Second Embodiment

Figure 3A:
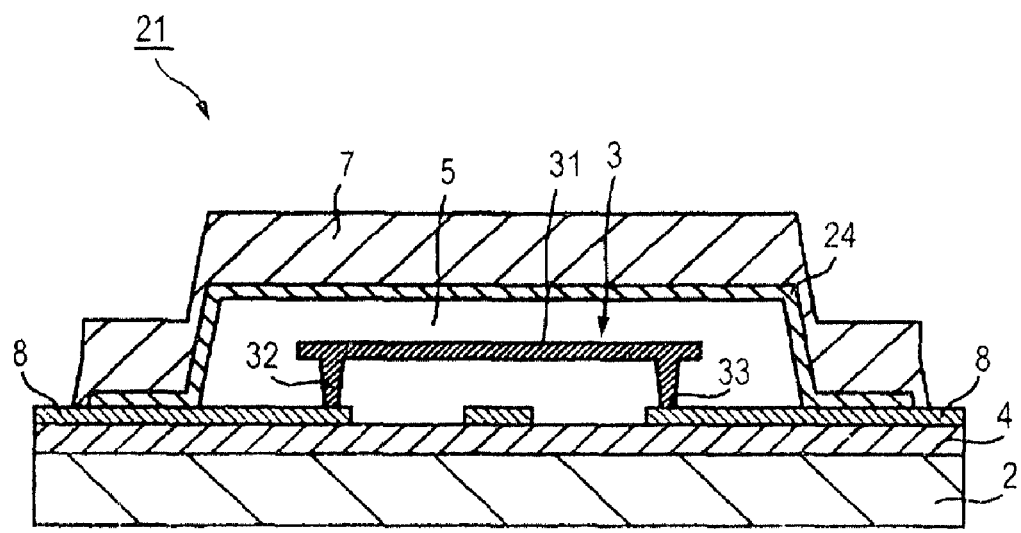
FIG. 3A is a cross-sectional view schematically illustrating the configuration of a MEMS package according to a second embodiment of the invention.
Figure 3B:
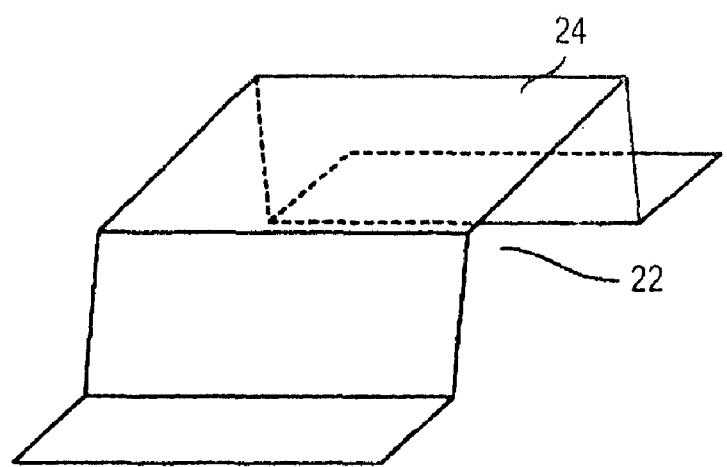
FIG. 3B is a perspective view illustrating a cavity formation film.

A MEMS package according to a second embodiment is described below with reference to FIGS. 3A and 3B. FIG. 3A is a cross-sectional view schematically illustrating the configuration of a MEMS package 21 according to the second embodiment of the invention. FIG. 3B is a perspective view schematically illustrating a cavity formation film 24 used in the MEMS package 21 shown in FIG. 3A. In FIGS. 3A and 3B, each of components of the second embodiment, which are the same as those of the first embodiment, is designated with the same reference numeral as that designating the same component of the first embodiment. Thus, the description of such components is simplified or partially omitted.

As illustrated in FIG. 3A, the MEMS package 21 according to the second embodiment includes a substrate 2, a MEMS device 3, a cavity formation film 24, and a seal layer 7 formed by the AD method, similarly to the first embodiment. The second embodiment differs from the first embodiment in the position and the shape of a through hole 22 for removing the sacrificing layer 10.

The through hole 22 is formed at least one of side surfaces of the cavity formation film 24. As long as the through hole 22 is formed by removing at least a part of the side surface of the cavity formation film 24, the through hole 22 can have any shape. In the second embodiment, the through hole 22 is formed on the two opposed side surfaces of the quadrangular-prismoid-like film, as illustrated in FIG. 3B. The through hole 22 is formed by removing the entire two opposed side surfaces. Consequently, according to the second embodiment, a sacrificing layer 10 can be efficiently and quickly removed, as compared with the first embodiment in which the through hole 9 is formed in a part of the top surface of the quadrangular prismoid. Further, since the through hole 22 is positioned on the side surfaces of the quadrangular prismoid, the film formation material is prevented from entering into the inner side of the cavity formation film 24 when the seal layer 7 is formed by the AD method. At the inner side of the cavity formation film 24, the seal layer 7 is disposed only in the vicinity of the through hole 22. The film formation material can more effectively be prevented from adhering to the MEMS device 3. Incidentally, to remove the sacrificing layer 10 more quickly, the additional through hole 22 may be formed on the remaining two side surfaces of the quadrangular-prismoid-like film illustrated in FIG. 3B, by partially removing the remaining two side surfaces.

The aforementioned MEMS package 21 according to this embodiment is manufactured by, e.g., the following method. FIGS. 4A to 4F are cross-sectional views schematically illustrating steps of the method for manufacturing the MEMS package 21 illustrated in FIG. 3A. The manufacturing method according to this embodiment is similar to that according to the first embodiment. Thus, the description of the manufacturing method according to the second embodiment is simplified or partly omitted.

Figure 4A:
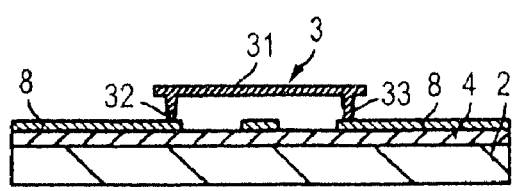
FIGS. 4A to 4F are cross-sectional views schematically illustrating steps of a method for manufacturing the MEMS package illustrated in FIG. 3A.

First, as illustrated in FIG. 4A, a wiring layer 8 is formed on the semiconductor substrate 2 via an insulating layer 4. And, a MEMS device 3 including a movable portion 31 and support portions 32 and 33 is formed on the wiring layer 8.

Subsequently, the sacrificing layer 10 made of polyimide is stacked on the semiconductor substrate 2. In addition, an organic insulating film such as a resist 12 is applied onto the sacrificing layer 10. Then, the sacrificing layer 10 is shaped like a quadrangular prismoid by the taper etching, similarly to the aforementioned first embodiment (see FIG. 4B).

Figure 4D:
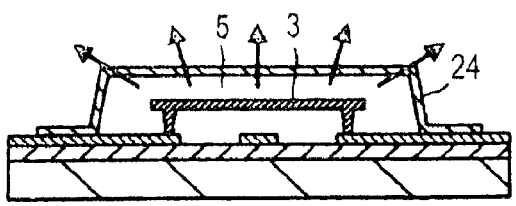
Figure 4B:
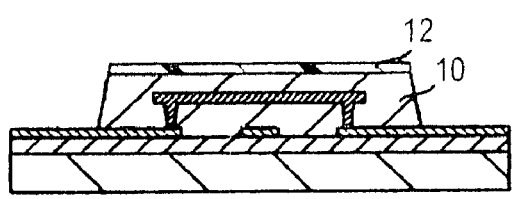
Figure 4E:
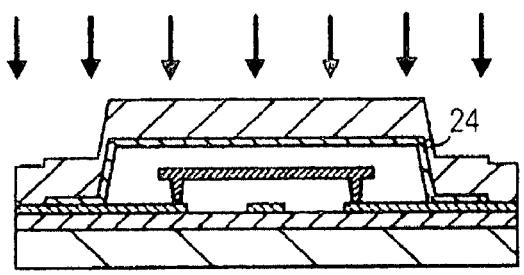
Figure 4C:
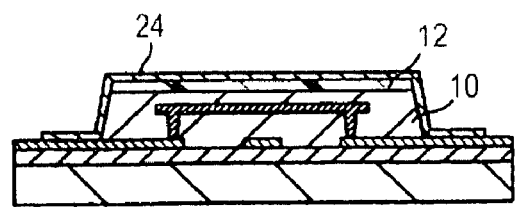
Figure 4F:
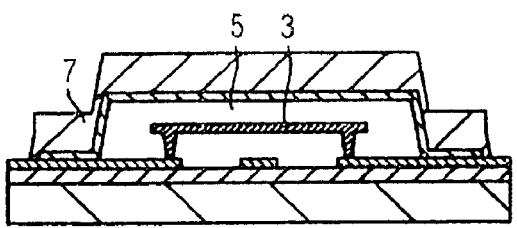

As illustrated in FIG. 4C, the cavity formation film 24 made of $SiO_2$ or the like is formed by the sputtering method, the CVD method or the like so as to cover the entire quadrangular-prismoid-like sacrificing layer 10 and the entire resist 12.

Subsequently, the entire two opposed side surfaces of the quadrangular-prismoid-like cavity formation film 24 are removed using the photolithography method and the dry etching method. Thus, the through hole 22 for removing the sacrificing members (the sacrificing layer 10 and the resist 12) is formed (see FIG. 3B).

Then, as illustrated in FIG. 4D, the resist 12 and the sacrificing layer 10 made of polyimide are collectively removed through the through hole 22 by ashing. Thus, a cavity 5 is formed around the MEMS device 3.

Subsequently, as illustrated in FIG. 4E, a thin film made of a ceramic material (e.g., AlN) is formed on the cavity formation film 24 using the AD method. Then, a seal layer 7 is formed by patterning the thin film by the photolithography method or the dry etching method (see FIG. 4F). Consequently, the through hole 22 is blocked by the seal layer 7. Thus, the MEMS device 3 is sealed in the cavity 5.

As described above, according to the second embodiment, the through hole 22 is formed by removing the entire two opposed side surfaces of the quadrangular-prismoid-like film. Consequently, the sacrificing layer 10 can be removed from the through hole 22 in a short time (about 10 minutes to 15 minutes). Thus, the productivity of the MEMS package 21 can be enhanced.

Moreover, by forming the through hole 22 on the side surfaces of the quadrangular-prismoid-like film, and by forming the seal layer 7 by the AD method, the adhesion of the film formation material to the MEMS device 3 can more effectively be prevented.

Additionally, similarly to the first embodiment, the seal layer 7 can be formed using a stencil mask on which openings are formed at the desired portions. Consequently, the film formation and the patterning can be performed at the same time. Thus, working efficiency can be enhanced.

Further, similarly to the first embodiment, the seal layer 7 can be formed using the STP method.

Incidentally, the invention is not limited to the foregoing description of the embodiments thereof. The invention may be appropriately modified in various ways without departing from the spirit of the invention. For example, the materials, structures, shape, substrates, and processes described in the foregoing description of the first and second embodiments are merely examples. Another material, structure, shape, substrate, and process differing from those described in the foregoing description can be used as need arises.

According to an aspect of the present invention, a MEMS package that prevents the degradation of characteristics of a MEMS device and that excels in reliability is provided. In addition, a method for manufacturing the same is provided.

What is claimed is:

1. A method for manufacturing a MEMS package, the method comprising:
   forming a MEMS device on a substrate;
   forming a sacrificing member on the MEMS device;
   forming a cavity formation film including a top face and a side face on the sacrificing member;
   forming a through hole in the side face of the cavity formation film at a side of the MEMS device;
   removing the sacrificing member through the through hole, thereby forming a cavity around the MEMS device; and
   forming a seal layer on the cavity formation film to block the through hole and to seal the cavity, by performing a film forming process in which a seal layer material is straightly applied in a direction perpendicular to a surface of the substrate.

2. The method according to claim 1, wherein the cavity formation film has a top face and side faces, and the through hole is formed by removing two opposing side faces of the cavity formation film.

3. The method according to claim 1, wherein the seal layer is formed on the cavity formation film and inside the cavity.

4. The method according to claim 3, wherein the seal layer is formed to be in contact with an inner side surface of the cavity formation film.

5. The method according to claim 1, wherein the film forming process includes: an aerosol deposition method; or a spin on glass film transfer and hot pressing method.

6. The method according to claim 1, wherein the seal layer material includes ceramics.

7. A MEMS package, comprising:
   a substrate;
   a MEMS device formed on the substrate;
   a cavity formation film that is formed on the substrate to define a cavity around the MEMS device and that includes a top face and a side face and a through hole formed therein in the side face of the cavity formation film at a side of the MEMS device; and
   a seal layer formed on the cavity formation film to block the through hole and to seal the cavity.

8. The MEMS package according to claim 7, wherein the seal layer is formed on a portion of the cavity formation film inside the cavity around the through hole.

9. The MEMS package according to claim 7, wherein the seal layer is formed also on a portion inside the cavity around the through hole.

10. The MEMS package according to claim 7, wherein the seal layer is formed on the cavity formation film and inside the cavity.

11. The MEMS package according to claim 10, wherein the seal layer is formed to be in contact with an inner side surface of the cavity formation film.

12. The MEMS package according to claim 11, wherein the seal layer in the cavity layer has a pillar shape which is continuously provided from the seal layer outside the cavity.

13. The MEMS package according to claim 7, wherein the cavity formation film has a tapered or curved portion at a side of the MEMS device.

14. The MEMS package according to claim 13, wherein the seal layer is provided inside the cavity, and the seal layer inside the cavity is in contact with the tapered or curved portion of the cavity formation film.

15. The MEMS package according to claim 14, wherein the seal layer inside the cavity is in contact with the tapered or curved portion of the cavity formation film so as to support the tapered or curved portion.

16. The MEMS package according to claim 7, wherein the cavity formation film has a top face and two opposing side faces, and the two opposing side faces are provided in a side perpendicular to a longitudinal direction of the MEMS device.

17. The MEMS package according to claim 7, wherein the through hole includes a plurality of through holes, and the plurality of through holes are symmetrically provided with respect to the MEMS device.

18. The MEMS package according to claim 7, wherein the seal layer is made of ceramics.

\* \* \* \* \*